US009917660B2

(12) United States Patent
Nakamura et al.

(10) Patent No.: US 9,917,660 B2
(45) Date of Patent: Mar. 13, 2018

(54) WIRELESS COMMUNICATION DEVICE AND WIRELESS COMMUNICATION SYSTEM

(71) Applicant: Panasonic Intellectual Property Management Co., Ltd., Osaka (JP)

(72) Inventors: Shigeki Nakamura, Kanagawa (JP); Noriaki Saito, Tokyo (JP); Taiji Akizuki, Miyagi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/151,372

(22) Filed: May 10, 2016

(65) Prior Publication Data
US 2016/0344484 A1    Nov. 24, 2016

(30) Foreign Application Priority Data

May 19, 2015  (JP) .................................. 2015-102177
Dec. 7, 2015   (JP) .................................. 2015-238493

(51) Int. Cl.
*H04K 1/02* (2006.01)
*H04B 17/13* (2015.01)
*H03F 3/195* (2006.01)
*H03G 3/30* (2006.01)
*H04B 1/04* (2006.01)

(52) U.S. Cl.
CPC ............. *H04B 17/13* (2015.01); *H03F 3/195* (2013.01); *H03G 3/3042* (2013.01); *H04B 1/0475* (2013.01); *H04B 2001/045* (2013.01)

(58) Field of Classification Search
CPC ....................................................... H04B 17/13

USPC .......................................................... 375/297
See application file for complete search history.

(56) References Cited

U.S. PATENT DOCUMENTS

2012/0008705 A1* 1/2012 Lee ...................... H04B 1/0475
375/285
2015/0111512 A1   4/2015 Tsukizawa

FOREIGN PATENT DOCUMENTS

JP   5-122087        5/1993
JP   2009-089202     4/2009

OTHER PUBLICATIONS

Extended European Search Report dated Oct. 7, 2016, for corresponding EP Application No. 16168915.3-1805, 7 pages.

* cited by examiner

*Primary Examiner* — Lihong Yu
(74) *Attorney, Agent, or Firm* — Seed IP Law Group LLP

(57) ABSTRACT

A wireless communication device includes a baseband variable gain amplifier that amplifies a transmission baseband signal, a local variable gain amplifier that amplifies a local signal, a frequency-conversion circuit that mixes the amplified transmission baseband signal and the amplified local signal to carry out a frequency conversion into a transmission high-frequency signal, a first detector that detects a power of the transmission high-frequency signal, and a controller that controls at least one of a gain of the transmission baseband variable gain amplifier and a gain of the local variable gain amplifier on the basis of the detected power of the transmission high-frequency signal so that a power of the transmission high-frequency signal to be detected takes a predetermined value.

4 Claims, 4 Drawing Sheets

WIRELESS COMMUNICATION DEVICE AND WIRELESS COMMUNICATION SYSTEM

BACKGROUND

1. Technical Field

The present disclosure relates to wireless communication devices, such as wireless transmission devices, that transmit signals of high-frequency waves, such as microwaves, sub-millimeter waves, or millimeter waves, (hereinafter, referred to as high-frequency signals) and relates to wireless communication systems that include a plurality of such wireless communication devices.

2. Description of the Related Art

In the field of wireless communication using microwave and millimeter-wave bands, high-frequency circuits (hereinafter, referred to as radio-frequency (RF) circuits) are being developed under the complementary metal-oxide semiconductor (CMOS) technology, and the study on reducing the size and the power consumption of RF circuits is being carried out for the commercialization of RF circuits.

For example, in a specific low-power wireless communication device that uses a millimeter-wave band, such as a 79-GHz band, the strength of the transmission waves, that is, the power level of the transmission signals is specified. For example, in a high-frequency range, such as a millimeter-wave band, the threshold voltage of a transistor constituting an integrated-circuit chip (hereinafter, referred to as an IC chip) varies in accordance with a variation in a semiconductor process technology, a variation in the temperature, or a variation in the power-supply voltage, and thus the high-frequency characteristics vary greatly. Accordingly, the power of transmission signals may vary, and thus the power of the transmission signals needs to be controlled. Specifically, the transmission power level needs to be controlled to stay constant by measuring the power level of the transmission signals.

Japanese Unexamined Patent Application Publication No. 5-122087 and Japanese Unexamined Patent Application Publication No. 2009-89202, for example, are known as existing techniques related to a wireless communication device that controls the power level of transmission signals to stay constant. The wireless transmission device described in Japanese Unexamined Patent Application Publication No. 5-122087 changes the power level of a baseband signal by changing a reference voltage applied to a DA converter in accordance with the result of measuring the power level of high-frequency signals and thus controls the transmission power level of the high-frequency signals to stay constant.

In addition, an RF power amplification device described in Japanese Unexamined Patent Application Publication No. 2009-89202 applies, to a RF power amplifier, an automatic power control voltage that is output by an error amplifier to which a negative-feedback circuit and an attenuator are connected in accordance with the result of measuring the power level of high-frequency signals and thus controls the transmission power level of the high-frequency signals to stay constant.

SUMMARY

However, although, as illustrated in FIG. 1 of Japanese Unexamined Patent Application Publication No. 5-122087, Japanese Unexamined Patent Application Publication No. 2009-89202 indicates that the transmission power levels of the baseband signal and the high-frequency signal are controlled to stay constant, Japanese Unexamined Patent Application Publication No. 2009-89202 does not disclose a means for measuring the power level of a local oscillation signal (hereinafter, also referred to as a local signal) input to a frequency-conversion circuit that generates a high-frequency signal, and is not directed to controlling the power level to stay constant.

In addition, according to Japanese Unexamined Patent Application Publication No. 5-122087, as illustrated in FIG. 2 of Japanese Unexamined Patent Application Publication No. 5-122087, the output power level of the high-frequency signal is controlled by varying the automatic power control voltage of the power amplifier in accordance with the detected output of the output transmission power, and the output power level is controlled solely by controlling the gain of the power amplifier.

Accordingly, an issue remains that even if the transmission power level of a high-frequency signal is controlled to stay constant by varying the power level of a baseband signal, it is difficult to control the transmission power level of the high-frequency signal to stay constant when the power level of a local signal input to a frequency-conversion circuit fluctuates.

Thus, a non-limiting exemplary embodiment of the present disclosure provides a wireless communication device that can obtain a transmission high-frequency signal of a desired power level even when the power level of a local signal varies.

In one general aspect, the techniques disclosed here feature a wireless communication device that includes a baseband variable gain amplifier that amplifies a transmission baseband signal, a local variable gain amplifier that amplifies a local signal, a frequency-conversion circuit that mixes the amplified transmission baseband signal and the amplified local signal to carry out a frequency conversion into a transmission high-frequency signal, a first detector that detects a power of the transmission high-frequency signal, and a controller that controls at least one of a gain of the transmission baseband variable gain amplifier and a gain of the local variable gain amplifier on the basis of the detected power of the transmission high-frequency signal so that a power of the transmission high-frequency signal to be detected takes a predetermined value.

According to the present disclosure, even when the power level of a local signal varies, a transmission high-frequency signal of a desired power level can be obtained.

These general and specific aspects may be implemented using a device, a system, a method, and a computer program, and any combination of devices, systems, methods, and computer programs.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
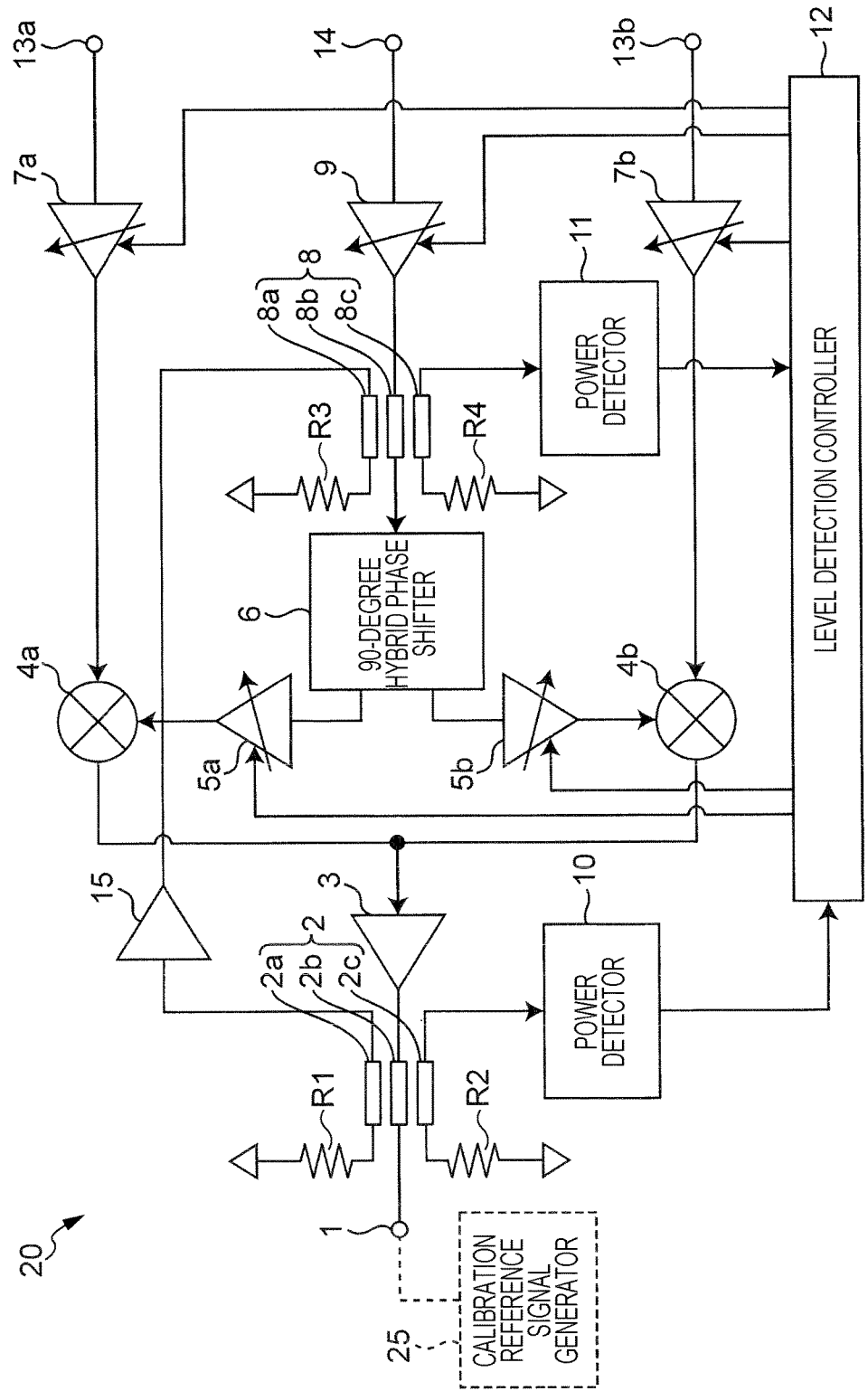
FIG. 1 illustrates a configuration example of a wireless communication device according to a first embodiment of the present disclosure.

Hereinafter, embodiments of the present disclosure will be described with reference to the drawings. It is to be noted that similar constituent elements are given identical reference characters in the embodiments described hereinafter.
First Embodiment FIG. 1 is a block diagram illustrating a configuration example of a wireless communication device 20 according to a first embodiment of the present disclosure. The wireless communication device 20 illustrated in FIG. 1 includes baseband variable gain amplifiers 7a and 7b, frequency-conversion circuits 4a and 4b, a local variable gain amplifier 9, a 90-degree hybrid phase shifter 6, local variable gain amplifiers 5a and 5b, a power amplifier 3, couplers 2 and 8, power detectors 10 and 11, a reference signal amplifier 15, a level detection controller 12, and terminators R1 to R4.

The baseband variable gain amplifiers 7a and 7b receive inputs of a common-mode analog baseband signal and an orthogonal analog baseband signal, respectively, via baseband signal input terminals 13a and 13b and amplify the common-mode analog baseband signal and the orthogonal analog baseband signal. The common-mode analog baseband signal and the orthogonal analog baseband signal have phases that are orthogonal to each other, or in other words, have a phase difference of 90 degrees. The gains of the baseband variable gain amplifiers 7a and 7b are controlled by control values of control signals generated by the level detection controller 12, which will be described later. The amplified common-mode analog baseband signal and the amplified orthogonal analog baseband signal are input to the frequency-conversion circuits 4a and 4b, respectively. The local variable gain amplifier 9 amplifies a local signal, which is a millimeter-wave signal in a 79-GHz band, for example, input via a local signal input terminal 14, and outputs the amplified local signal to the 90-degree hybrid phase shifter 6 via a transmission line 8b of the coupler 8. The gain of the local variable gain amplifier 9 is controlled by a control value of a control signal generated by the level detection controller 12, which will be described later.

The coupler 8 is constituted by a nondirectional coupler, such as a two-end-output coupler, and includes three transmission lines 8a, 8b, and 8c that are electromagnetically coupled to one another. In the coupler 8, the transmission line 8b is connected at one end to an output terminal of the local variable gain amplifier 9 and connected at the other end to an input terminal of the 90-degree hybrid phase shifter 6. In addition, the transmission line 8a is connected at one end to an output terminal of the reference signal amplifier 15 and grounded at the other end via the terminator R3. Furthermore, the transmission line 8c is connected at one end to an input terminal of the power detector 11 and terminated at the other end via the terminator R4. Accordingly, the coupler 8 detects a part of an amplified local signal input thereto and outputs the result to the power detector 11. The power detector 11 then detects the part of the local signal detected by the coupler 8, detects the power level of that local signal, and outputs the result to the level detection controller 12.

The 90-degree hybrid phase shifter 6 receives an input of a local signal amplified by the local variable gain amplifier 9 via the coupler 8, and generates a common-mode local signal and an orthogonal local signal that have phases orthogonal to each other, or in other words, that have a phase difference of 90 degrees on the basis of the received local signal. The 90-degree hybrid phase shifter 6 then outputs the common-mode local signal to the frequency-conversion circuit 4a via the local variable gain amplifier 5a and outputs the orthogonal local signal to the frequency-conversion circuit 4b via the local variable gain amplifier 5b. The local variable gain amplifiers 5a and 5b amplify the common-mode local signal and the orthogonal local signal, respectively, generated by the 90-degree hybrid phase shifter 6 and output the results to the frequency-conversion circuits 4a and 4b.

The frequency-conversion circuits 4a and 4b each include a mixer and a high-pass filter. The frequency-conversion circuit 4a mixes the amplified common-mode analog baseband signal and the amplified common-mode local signal so as to generate an upconverted high-frequency signal (i.e., a signal obtained by modulating a predetermined carrier wave in accordance with the common-mode local signal), and outputs the upconverted high-frequency signal to a transmission signal output terminal 1 via the power amplifier 3 and a transmission line 2b of the coupler 2. Meanwhile, the frequency-conversion circuit 4b mixes the amplified orthogonal analog baseband signal and the amplified orthogonal local signal so as to generate an upconverted high-frequency signal (i.e., a signal obtained by modulating a predetermined carrier wave in accordance with the orthogonal local signal), and outputs the upconverted high-frequency signal to the transmission signal output terminal 1 via the power amplifier 3 and the transmission line 2b of the coupler 2.

When the wireless communication device 20 is in operation, an antenna is connected to the transmission signal output terminal 1, and the aforementioned high-frequency signals are transmitted and radiated through the antenna. Meanwhile, when the wireless communication device 20 is not in operation, a calibration reference signal generator 25 is connected to the transmission signal output terminal 1, and a calibration reference signal is output from the calibration reference signal generator 25 to the power detector 11 via the reference signal amplifier 15 and the coupler 8 so as to calibrate the power value, which will be described later in detail.

The coupler 2 is constituted by a nondirectional coupler, such as a two-end-output coupler, and includes three transmission lines 2a, 2b, and 2c that are electromagnetically coupled to one another. In the coupler 2, the transmission line 2b is connected at one end to an output terminal of the power amplifier 3 and connected at the other end to the transmission signal output terminal 1. In addition, the transmission line 2a is connected at one end to an input terminal of the reference signal amplifier 15 and grounded at the other end via the terminator R1. Furthermore, the transmission line 2c is connected at one end to an input terminal of the power detector 10 and grounded at the other end via the terminator R2.

As described thus far, the transmission line 2a of the coupler 2 and the transmission line 8a of the coupler 8 may be connected to each other via the reference signal amplifier 15 constituting, for example, a buffer amplifier having a gain of 0; the wireless communication device 20 may be put in a non-operating state (specifically, the power amplifier 3 and the frequency-conversion circuits 4a and 4b may be put in a non-operating state); the reference signal amplifier 15 may be put in an operating state; the calibration reference signal generator 25, for example, may be connected to the transmission signal output terminal 1; and a reference signal serving as a predetermined high-frequency signal may then be input to the transmission signal output terminal 1. Through this, this reference signal can be detected by the power detector 11 via the coupler 2, the reference signal amplifier 15, and the coupler 8. Thus, the output characteristics of the power detector 11 can be calibrated, and the accuracy in the output of the power detector 11 can be improved.

As a modification, the amplification direction of the reference signal amplifier 15 may be reversed, and thus the power level of a local signal detected by the coupler 8 may be measured in the transmission signal output terminal 1.

When the power level of a local signal is not to be checked in the transmission signal output terminal 1 or when a reference signal is not to be input through the transmission signal output terminal 1, by putting the wireless communication device 20 in an operating state while the reference signal amplifier 15 is put in a non-operating state and the remaining circuits are put in an operating state, a local signal can be prevented from being mixed into a high-frequency signal at the output terminal of the power amplifier 3.

The power detector 10 detects a part of the transmission high-frequency signal detected by the coupler 2, detects the power level of that transmission signal, and outputs the result to the level detection controller 12. The level detection controller 12 carries out control by generating a control signal so as to change the gain of at least one of the baseband variable gain amplifiers 7a and 7b and the local variable gain amplifier 9 so that the transmission power in the transmission signal output terminal 1 becomes a predetermined power level, on the basis of the power level of the transmission high-frequency signal obtained in the power detector 10 and the power level of the local signal obtained in the power detector 11. The level detection controller 12 may or may not generate and output a control signal containing a currently set control signal value to each of the variable gain amplifiers 5a, 5b, and 9 of which gains are not to be changed.

As described thus far, the configuration according to the first embodiment makes it possible to calibrate the power level with the power detector 11 by inserting and connecting the reference signal amplifier 15 between the coupler 2 and the coupler 8 and by inputting a calibration reference signal from the calibration reference signal generator 25 to the transmission signal output terminal 1. Alternatively, as in the modification, the power level of a local signal can be measured in the transmission signal output terminal 1 by reversing the amplification direction of the reference signal amplifier 15. Through this, the accuracy in detecting the power level of a local signal is improved, and the accuracy in adjusting the gain of the variable gain amplifiers 5a, 5b, and 9 is also improved. Thus, the level detection controller 12 can transmit a transmission high-frequency signal having a desired transmission power level through the transmission signal output terminal 1.

In the present embodiment, the input terminal for the calibration reference signal is shared by the transmission signal output terminal 1, but the input terminal does not have to be shared, and an independent terminal for inputting the calibration reference signal may be provided. In addition, the coupler 2 and the coupler 8 are connected with the reference signal amplifier 15 interposed therebetween, but the reference signal amplifier 15 does not have to amplify a signal and may attenuate a signal or may simply let a signal pass therethrough.

In the present embodiment, a local signal is input through the local signal input terminal 14, but a local signal does not have to be input from the outside. For example, a voltage controlled oscillator (VCO) may be connected, and a local signal may be input from the VCO.

The wireless communication device 20 according to the present embodiment employs a direct conversion system, but the present embodiment does not have to be limited to this system in particular. Any system that includes the baseband variable gain amplifiers 7a and 7b and the local variable gain amplifier 9 may be employed, and a similar effect can be obtained, for example, with a heterodyne system as well.

Second Embodiment

Figure 2:
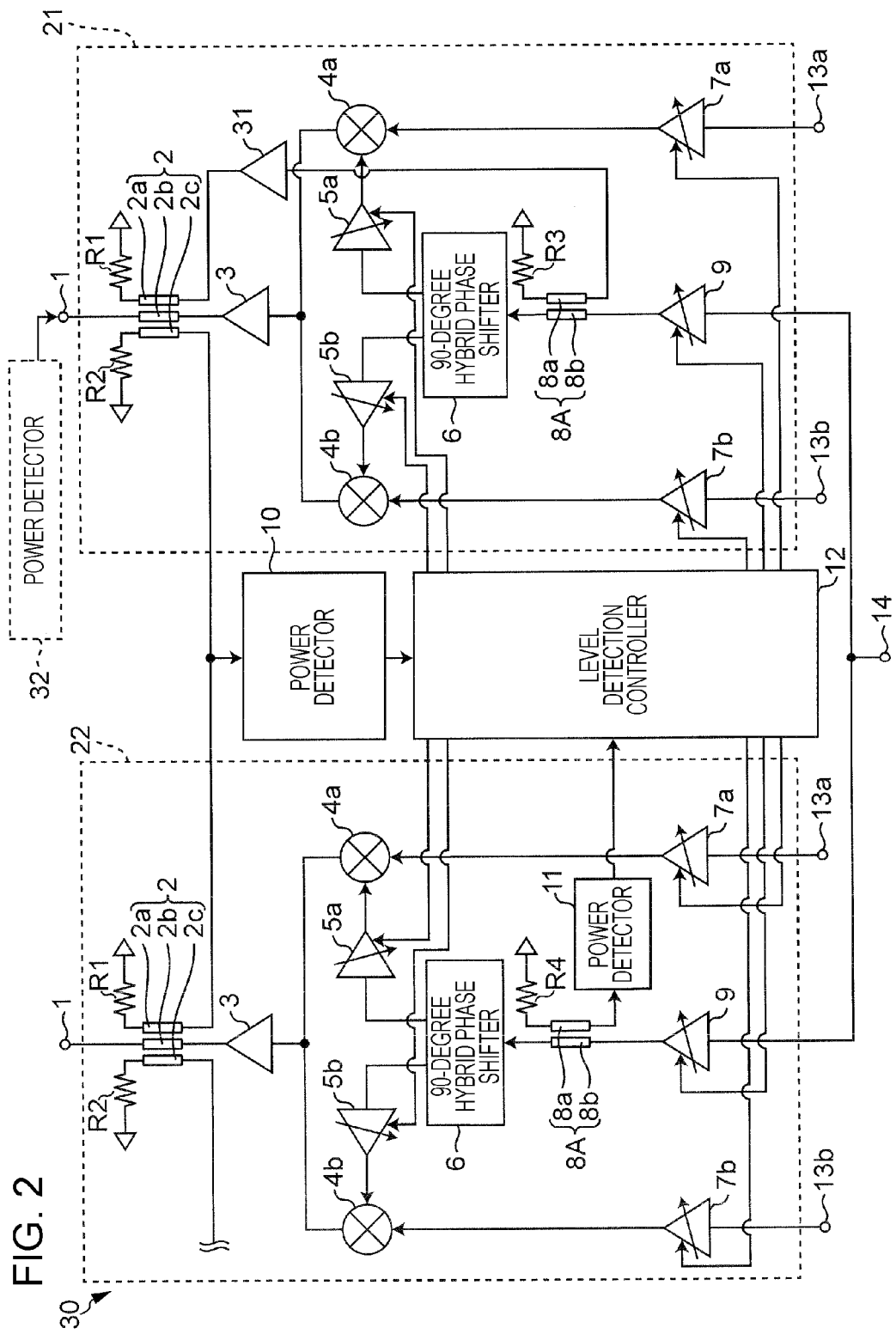
FIG. 2 illustrates a configuration example of a wireless communication system according to a second embodiment of the present disclosure.

FIG. 2 illustrates a circuit configuration of a wireless communication system 30 according to a second embodiment of the present disclosure. In FIG. 2, constituent elements that are identical to those illustrated in FIG. 1 are given identical reference characters, and descriptions thereof will be omitted. The wireless communication system 30 illustrated in FIG. 2 includes a first transmission system unit (wireless communication device) 21 and a second transmission system unit (wireless communication device) 22. The first and second transmission system units 21 and 22 each have the same configuration as the wireless communication device 20 illustrated in FIG. 1 except for the following differences. Although the wireless communication system 30 illustrated in FIG. 2 includes the two transmission system units (wireless communication devices) 21 and 22, the wireless communication system 30 may include three or more wireless communication devices.

(1) The first transmission system unit 21 includes a reference local signal amplifier 31 in place of the reference signal amplifier 15, and the amplification direction of the reference local signal amplifier 31 is reversed from that of the reference signal amplifier 15. In addition, the second transmission system unit 22 includes neither the reference signal amplifier 15 nor the reference local signal amplifier 31.

(2) The first and second transmission system units 21 and 22 each include a coupler 8A in place of the coupler 8. The coupler 8A is constituted by a nondirectional coupler, such as a two-end-output coupler, and includes two transmission lines 8a and 8b that are electromagnetically coupled to each other. In the first transmission system unit 21, the transmission line 8a is connected at one end to an input terminal of the reference local signal amplifier 31 and grounded at the other end via the terminator R3. In the second transmission system unit 22, the transmission line 8a is connected at one end to an input terminal of the power detector 11 and grounded at the other end via the terminator R4.

(3) Only a single power detector 10 is provided in the wireless communication system 30. The transmission line 2c of the coupler 2 in the first transmission system unit 21 is connected at one end to an input terminal of the power detector 10, and the transmission line 2a of the coupler 2 in the second transmission system unit 22 is connected at one end to the input terminal of the power detector 10. When three or more wireless communication devices (transmission system units) are to be provided, the transmission line 2c of the coupler 2 in the second transmission system unit 22 may be connected at one end to one end of a transmission line 2a of a coupler 2 in a third transmission system unit, and the rest is the same.

(4) The power detector 10, the level detection controller 12, and the local signal input terminal 14 are provided as external circuits of the first and second transmission system units 21 and 22. The local signal input terminal 14 is formed as a single terminal by connecting local signal input terminals of the respective transmission system units 21 and 22. In addition, the power detector 10 detects a part of transmission high-frequency signals from the couplers 2 in the respective transmission system units 21 and 22, detects the power levels of the transmission high-frequency signals, and outputs the results to the level detection controller 12. The level detection controller 12 controls at least one of the local variable gain amplifiers 9 and the baseband variable gain amplifiers 7a and 7b in the transmission system units 21 and 22 such that the power level of the transmission high-frequency signals takes a predetermined value, on the basis of the power levels of the transmission high-frequency signals detected by the power detector 10 and the power level of a local signal detected by the power detector 11. The gains of the local variable gain amplifiers 5a and 5b in the transmission system units 21 and 22 are adjusted in advance before the operation by the level detection controller 12.

In the wireless communication system according to the second embodiment configured as described above, as the reference local signal amplifier 31 is inserted and disposed between the coupler 2 and the coupler 8A in the transmission system unit 21, the power level of a local signal can be measured by a power detector 32 connected to the transmission signal output terminal 1 by putting the power amplifier 3 and the frequency-conversion circuits 4a and 4b in a non-operating state so as to put the wireless communication system 30 in a non-operating state and by putting the reference local signal amplifier 31 in an operating state.

When the power level of a local signal is not to be checked at the output terminal, a local signal can be prevented from being mixed into a high-frequency signal serving as an output of the power amplifier 3 by putting the reference local signal amplifier 31 in a non-operating state.

In addition, the power detector 10 detects a part of the transmission high-frequency signals detected by the couplers 2 in the transmission system units 21 and 22, detects the power levels of the transmission high-frequency signals, and outputs the results to the level detection controller 12. The level detection controller 12 carries out control by generating a control signal so as to change the gain of at least one of the baseband variable gain amplifiers 7a and 7b and the local variable gain amplifiers 9 in the transmission system units 21 and 22 so that the power levels of the transmission high-frequency signals become desired power levels, on the basis of the power levels of the transmission high-frequency signals obtained in the power detector 10 and the power level of the local signal obtained in the power detector 11.

In the second transmission system unit 22, the connection of the coupler 8A is different from that in the first transmission system unit 21, and the coupler 8A is connected to the power detector 11. The coupler 8A detects a part of a local signal amplified by the local variable gain amplifier 9, and the power detector 11 detects the power level of the local signal.

The configuration of the main signal path is identical between the first transmission system unit 21 and the second transmission system unit 22. Thus, although the transmission systems are different, the characteristics obtained when identical control is carried out in each variable amplifier in the local variable gain amplifiers 9 are identical. Therefore, the power detectors 10 and 11 can be calibrated by measuring an output of a local signal in the first transmission system unit 21 and by detecting the power level of the local signal in the second transmission system unit 22.

The configuration of the wireless communication system according to the second embodiment makes it possible to calibrate the power detector for a local signal by detecting the power level of the local signal at an input stage and an output stage of the local signal in different transmission systems. Thus, the accuracy in detecting the power level of a local signal is improved, and the accuracy in adjusting the variable gain amplifiers 7a, 7b, and 9 is also improved. Accordingly, a desired output power level of a power amplifier can be obtained through the transmission signal output terminal 1.

In the present embodiment as well, the output of the reference local signal amplifier 31 is shared by the transmission signal output terminal 1, but the output does not have to be shared, and an independent terminal for outputting a local signal may be provided.

The power detector 10 and the level detection controller 12 are shared by the first transmission system unit 21 and the second transmission system unit 22 with the use of, for example, a two-end coupler, but the power detector 10 and the level detection controller 12 do not have to be shared, and an independent power detector 11 and an independent level detection controller 12 may be provided in each transmission system.

As in the first embodiment, in the present embodiment as well, a local signal is input through the local signal input terminal 14, but a local signal does not have to be input from the outside. For example, a VCO may be connected, and a local signal may be input from the VCO.

The transmission system units 21 and 22 of the wireless communication system according to the present embodiment employ a direct conversion system, but the present embodiment does not have to be limited to this system in particular. Any system that includes the local variable gain amplifier 9 and the baseband variable gain amplifiers 7a and 7b may be employed, and a similar effect can be obtained, for example, with a heterodyne system as well.

Third Embodiment

Figure 3:
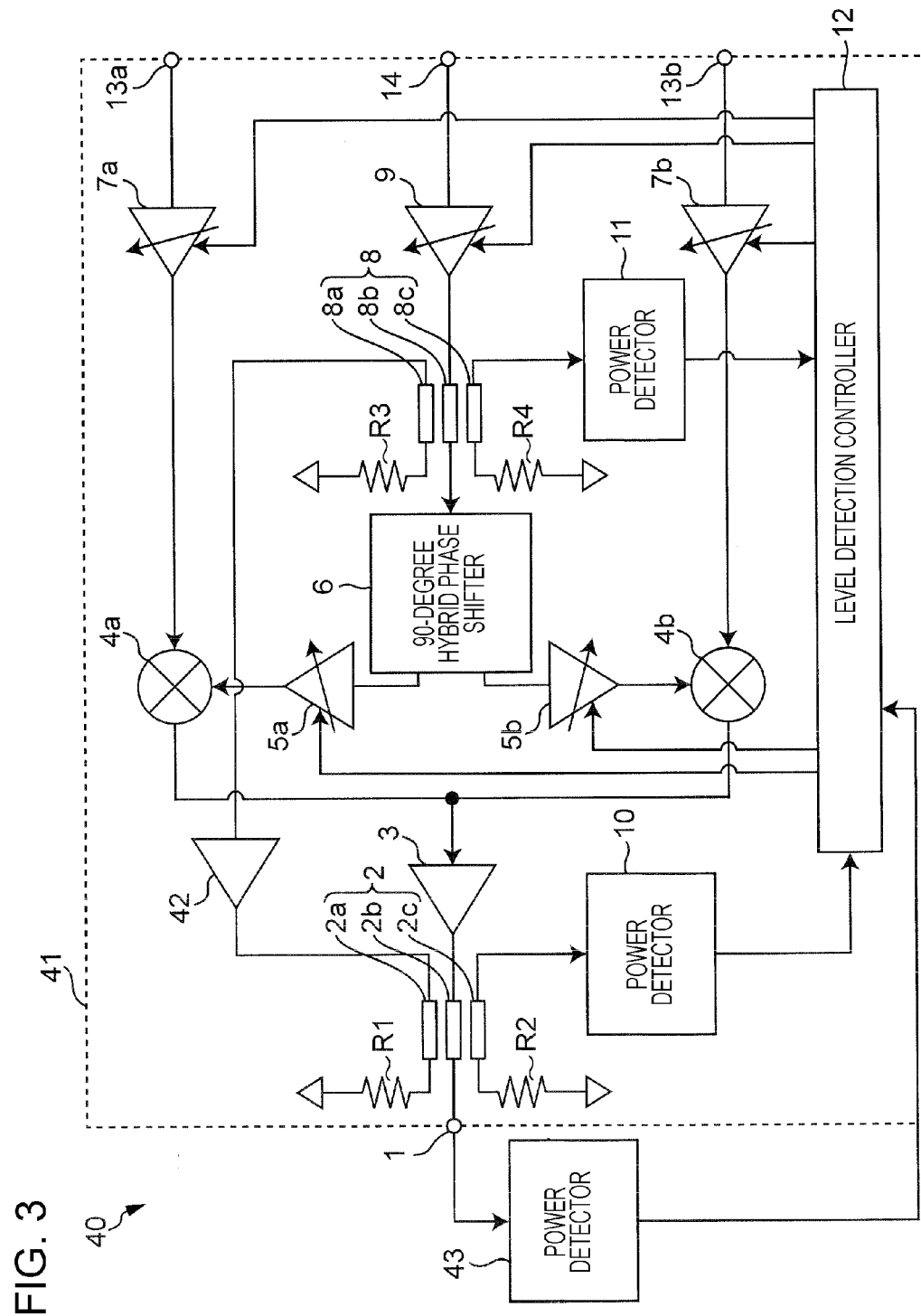
FIG. 3 illustrates a configuration example of a wireless communication system according to a third embodiment of the present disclosure.

FIG. 3 is a block diagram illustrating a circuit configuration of a wireless communication system 40 according to a third embodiment of the present disclosure. In FIG. 3, constituent elements that are identical to those illustrated in FIG. 1 are given identical reference characters, and descriptions thereof will be omitted.

In the configuration according to the first embodiment, an external calibration reference signal needs to be input to the transmission signal output terminal 1 from the calibration reference signal generator 25. Therefore, additional equipment is required for calibrating the power detector 11, and thus when such a configuration is applied, for example, in a millimeter-wave band signal generator, the signal generator becomes very expensive, leading to a problem in that the cost increases.

To solve such a problem, as illustrated in FIG. 3, the wireless communication system 40 according to the third embodiment includes a wireless communication device 41, and the wireless communication device 41 differs from the wireless communication device 20 illustrated in FIG. 1 in the following points. The wireless communication device 41 includes a reference local signal amplifier 42 in place of the reference signal amplifier 15, and the amplification direction of the reference local signal amplifier 42 is reversed from that of the reference signal amplifier 15. The wireless communication system 40 includes the wireless communication device 41 and a power detector 43. Hereinafter, the differences will be described.

In FIG. 3, the reference local signal amplifier 42 is provided between an output terminal of the local variable gain amplifier 9 and the transmission signal output terminal 1. The reference local signal amplifier 42 amplifies a local signal serving as a calibration reference signal input to an input terminal of the local variable gain amplifier 9 and outputs the amplified local signal to the transmission signal output terminal via the coupler 2 while the wireless communication device 41 is not in operation.

According to such a configuration, the power level of the local signal can be detected by the power detector 43 connected to the transmission signal output terminal 1. Accordingly, upon the result of the detection of the power detector 43 being externally input to the level detection controller 12, the level detection controller 12 can control the local variable gain amplifier 9 such that the detected power of the transmission high-frequency signal takes a predetermined value on the basis of the detected power of the local signal, and the accuracy in detecting the power level of a local signal can be improved. As a result, the accuracy in adjusting the gain of the local variable gain amplifier 9 also improves, and thus the wireless communication device 41 can transmit a transmission high-frequency signal having a desired transmission power level through the transmission signal output terminal 1.

In addition, the level detection controller 12 includes a plurality of control tables and can control the gains of the local variable gain amplifiers 5a and 5b and the local variable gain amplifier 9 by determining a control table to be used on the basis of the result of the measurement of each of the power detectors 10, 11, and 43.

Figure 4:
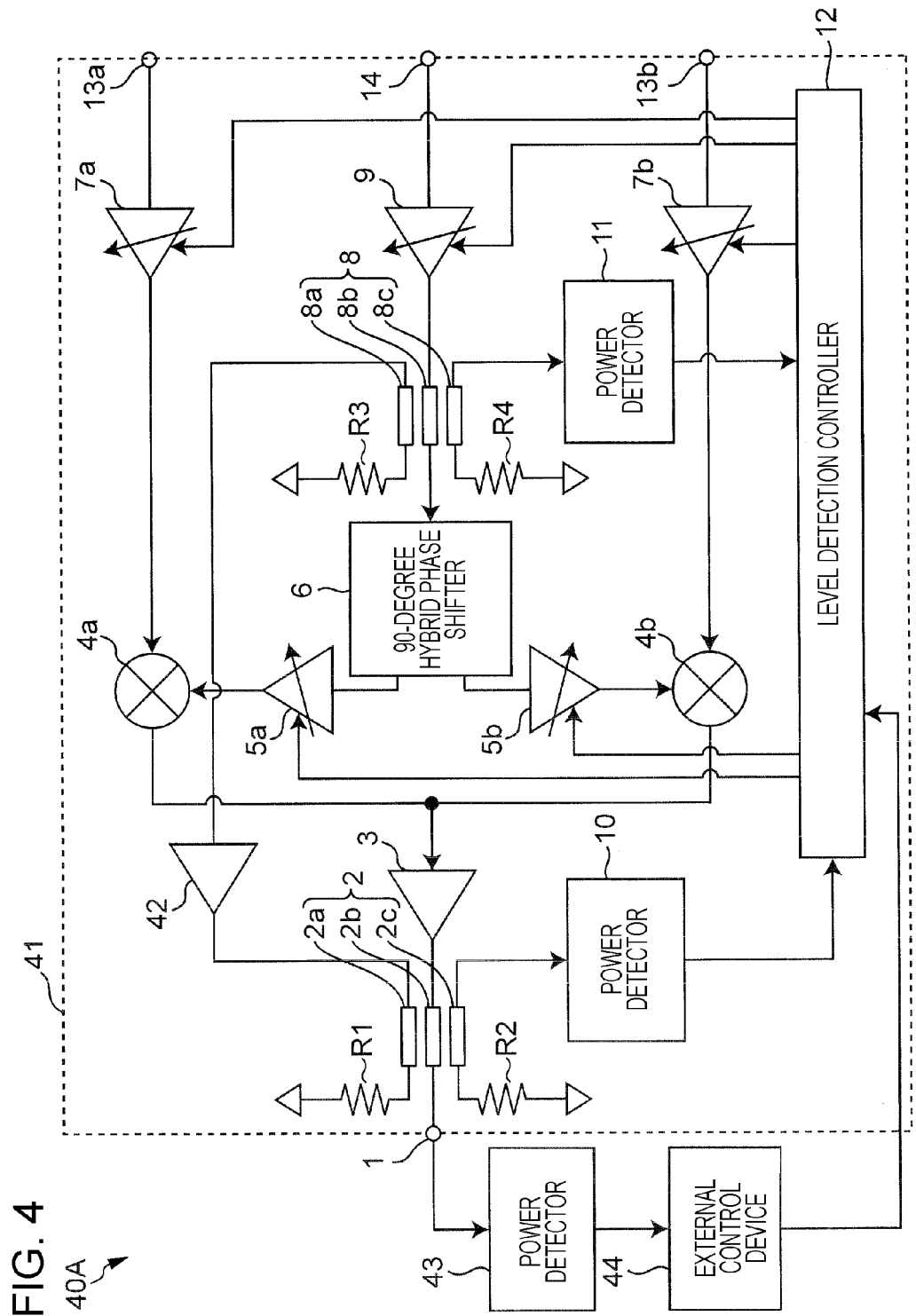
FIG. 4 illustrates a configuration example of a wireless communication system according to a modification of the third embodiment of the present disclosure.

FIG. 4 is a block diagram illustrating a circuit configuration of a wireless communication system 40A according to a modification of the third embodiment of the present disclosure. As compared with the wireless communication system 40 illustrated in FIG. 3, in the wireless communication system 40A according to the third embodiment illustrated in FIG. 4, an external control device 44 is inserted between the power detector 43 and the level detection controller 12.

In FIG. 4, the external control device 44, such as a microcomputer, that controls the level detection controller 12 is provided outside the wireless communication device 41. The external control device 44 controls the level detection controller 12 on the basis of a detection result signal input from the power detector 43. In this case, the control tables may not be stored in the level detection controller 12 but may be stored in a flash memory provided in the external control device 44.

In the third embodiment and the modification thereof, the output of the reference local signal amplifier 42 is shared by the transmission signal output terminal 1, but the output does not have to be shared, and an independent terminal for outputting a local signal may be provided.

In addition, in the third embodiment and the modification thereof as well, as in the first embodiment, a local signal is input through the local signal input terminal 14, but a local signal does not have to be input from the outside. For example, a VCO may be connected, and a local signal may be input from the VCO.

Furthermore, the wireless communication device 41 according to the third embodiment and the modification thereof employs a direct conversion system, but the present embodiment and its modification do not have to be limited to this system in particular. Any system that includes the baseband variable gain amplifiers 7a and 7b and the local variable gain amplifier 9 may be employed, and a similar effect can be obtained, for example, with a heterodyne system as well.

Overview of Embodiments

A wireless communication device according to a first aspect of the present disclosure includes
a baseband variable gain amplifier that amplifies a transmission baseband signal,
a local variable gain amplifier that amplifies a local signal,
a frequency-conversion circuit that mixes the amplified transmission baseband signal and the amplified local signal to carry out a frequency conversion into a transmission high-frequency signal,
a first detector that detects a power of the transmission high-frequency signal, and
a controller that controls at least one of a gain of the baseband variable gain amplifier and a gain of the local variable gain amplifier on the basis of the detected power of the transmission high-frequency signal so that a power of the transmission high-frequency signal to be detected takes a predetermined value.

In a wireless communication device according to a second aspect of the present disclosure, the wireless communication device according to the first aspect further includes a phase shifter that generates a common-mode local signal and an orthogonal local signal that are orthogonal to each other on the basis of the local signal, the frequency-conversion circuit includes a first frequency-conversion circuit and a second frequency-conversion circuit, and
the local variable gain amplifier includes
a first variable gain amplifier that amplifies the common-mode local signal to be input to the first frequency-conversion circuit as the amplified local signal, and
a second variable gain amplifier that amplifies the orthogonal local signal to be input to the second frequency-conversion circuit as the amplified local signal.

In a wireless communication device according to a third aspect of the present disclosure, the wireless communication device according to the first or second aspect further includes a second detector that detects a power of the local signal, and
the controller controls at least one of the gain of the baseband variable gain amplifier and the gain of the local variable gain amplifier on the basis of the detected power of the transmission high-frequency signal and the detected power of the local signal so that a power of the transmission high-frequency signal to be detected takes a predetermined value.

In a wireless communication device according to a fourth aspect of the present disclosure, the wireless communication device according to the third aspect further includes
a transmission output terminal connected to an output terminal of the frequency-conversion circuit via a coupler, and
a reference signal amplifier, connected between the transmission output terminal and the second detector, that amplifies a calibration reference signal input to the transmission output terminal and outputs the calibration reference signal to the second detector, and
the controller calibrates a power level within the controller on the basis of a power of a reference signal detected by the second detector while the wireless communication device is not in operation.

In a wireless communication device according to a fifth aspect of the present disclosure, the wireless communication device according to any one of the first to third aspects further includes a transmission output terminal connected to an output terminal of the frequency-conversion circuit via a coupler, a reference local signal amplifier, provided between an output terminal of the local variable gain amplifier and the transmission output terminal, that amplifies the local signal serving as a calibration reference signal input to an input terminal of the local variable gain amplifier and outputs the local signal to the transmission output terminal via the coupler while the wireless communication device is not in operation, a third detector that is connected to the transmission output terminal,; and a power of the local signal from the output terminal of the local variable gain amplifier is detected by the third detector.

A wireless communication system according to a sixth aspect of the present disclosure includes first and second transmission system units that each include the wireless communication device according to any one of the first to fourth aspects.

In a wireless communication system according to a seventh aspect of the present disclosure, the wireless communication system according to the sixth aspect includes transmission output terminals, provided in the respective first and second transmission system units, that are connected to each other via a coupler, and that are connected to the output terminal of the frequency-conversion circuit via the coupler, and a reference local signal amplifier ,provided between an output terminal of the local variable gain amplifier and the transmission output terminal in the first transmission system unit, that amplifies the local signal serving as a calibration reference signal input to an input terminal of the local variable gain amplifier and outputs the local signal to the transmission output terminal via the coupler while the wireless communication device is not in operation; and a third detector that is connected to the transmission output terminal, a power of the local signal from the output terminal of the local variable gain amplifier is detected by the third detector.

A wireless communication system according to an eighth aspect of the present disclosure includes a wireless communication device that includes a baseband variable gain amplifier that amplifies a transmission baseband signal, a local variable gain amplifier that amplifies a local signal, a frequency-conversion circuit that mixes the amplified transmission baseband signal and the amplified local signal to carry out a frequency conversion into a transmission high-frequency signal, a transmission output terminal connected to an output terminal of the frequency-conversion circuit via a coupler, a reference local signal amplifier, provided between an output terminal of the local variable gain amplifier and the transmission output terminal, that amplifies a local signal serving as a calibration reference signal input to an input terminal of the local variable gain amplifier and outputs the local signal to the transmission output terminal via the coupler while the wireless communication device is not in operation, and a controller that controls the local variable gain amplifier; and a fourth detector that detects a power of the local signal output from the transmission output terminal, and the controller controls the local variable gain amplifier on the basis of the detected power of the local signal so that a power of the transmission high-frequency signal to be detected takes a predetermined value.

Thus far, various embodiments have been described with reference to the drawings, but it is needless to say that the present disclosure is not limited to these examples. It is apparent that a person skilled in the art can conceive of various modified examples and revised examples within the spirit of the appended claims, and it is to be appreciated that such modified examples and revised examples are encompassed by the technical scope of the present disclosure.

The present disclosure is useful in a transmitter that uses a high-frequency wave or uses in particular a millimeter-wave band and that reduces a fluctuation in the transmission power and outputs a stable transmission power.

What is claimed is:

1. A wireless communication device, comprising:
   a baseband variable gain amplifier that amplifies a transmission baseband signal;
   a local variable gain amplifier that amplifies a local signal;
   a frequency-conversion circuit that mixes the amplified transmission baseband signal and the amplified local signal to carry out a frequency conversion into a transmission high-frequency signal;
   a first detector that detects a power of the transmission high-frequency signal;
   a second detector that detects a power of the local signal;
   a controller that controls at least one of a gain of the baseband variable gain amplifier and a gain of the local variable gain amplifier on the basis of the detected power of the transmission high-frequency signal and the detected power of the local signal so that a power of the transmission high-frequency signal to be detected takes a predetermined value;
   a transmission output terminal connected to an output terminal of the frequency-conversion circuit via a coupler; and
   a reference signal amplifier, connected between the transmission output terminal and the second detector, that amplifies a calibration reference signal input to the transmission output terminal and outputs the calibration reference signal to the second detector,
   wherein the controller calibrates a power level within the controller on the basis of a power of a reference signal detected by the second detector while the wireless communication device is not in operation.

2. A wireless communication device, comprising:
   a baseband variable gain amplifier that amplifies a transmission baseband signal;
   a local variable gain amplifier that amplifies a local signal;
   a frequency-conversion circuit that mixes the amplified transmission baseband signal and the amplified local signal to carry out a frequency conversion into a transmission high-frequency signal;
   a first detector that detects a power of the transmission high-frequency signal;
   a controller that controls at least one of a gain of the baseband variable gain amplifier and a gain of the local variable gain amplifier on the basis of the detected power of the transmission high-frequency signal so that a power of the transmission high-frequency signal to be detected takes a predetermined value;
   a transmission output terminal connected to an output terminal of the frequency-conversion circuit via a coupler;
   a reference local signal amplifier, provided between an output terminal of the local variable gain amplifier and the transmission output terminal, that amplifies the local signal serving as a calibration reference signal input to an input terminal of the local variable gain amplifier and outputs the local signal to the transmission output terminal via the coupler while the wireless communication device is not in operation; and a third detector that is connected to the transmission output terminal, wherein a power of the local signal from the output terminal of the local variable gain amplifier is detected by the third detector.

3. A wireless communication system, comprising:

first and second transmission systems that each include:
  a respective wireless communication device, wherein the respective wireless communication device includes:
    a baseband variable gain amplifier that amplifies a transmission baseband signal;
    a local variable gain amplifier that amplifies a local signal, wherein the local variable gain amplifier has an input terminal and an output terminal;
    a frequency-conversion circuit that mixes the amplified transmission baseband signal and the amplified local signal to carry out a frequency conversion into a transmission high-frequency signal, the frequency-conversion circuit having an output terminal;
    a first detector that detects a power of the transmission high-frequency signal;
    a second detector that detects a power of the local signal; and
    a controller that controls at least one of a gain of the baseband variable gain amplifier and a gain of the local variable gain amplifier on the basis of the detected power of the transmission high-frequency signal and the detected power of the local signal so that a power of the transmission high-frequency signal to be detected takes a predetermined value;
  transmission output terminals, provided in the respective first and second transmission systems, that are connected to each other via a coupler, and that are connected to the output terminal of the frequency-conversion circuit of the respective wireless communication device via the coupler;
  a reference local signal amplifier, provided between the output terminal of the local variable gain amplifier of the first wireless communication device and the transmission output terminal in the first transmission system, that amplifies the local signal serving as a calibration reference signal input to the input terminal of the local variable gain amplifier and outputs the local signal to the transmission output terminal via the coupler while the wireless communication device is not in operation; and
  a third detector that is connected to the transmission output terminal,
    wherein a power of the local signal from the output terminal of the local variable gain amplifier is detected by the third detector.

4. The wireless communication system according to claim 3, wherein the respective wireless communication device further includes:
  a phase shifter that generates a common-mode local signal and an orthogonal local signal that are orthogonal to each other on the basis of the local signal,
  wherein the frequency-conversion circuit includes a first frequency-conversion circuit and a second frequency-conversion circuit,
    wherein the local variable gain amplifier includes
      a first variable gain amplifier that amplifies the common-mode local signal to be input to the first frequency-conversion circuit as the amplified local signal, and
      a second variable gain amplifier that amplifies the orthogonal local signal to be input to the second frequency-conversion circuit as the amplified local signal.

* * * * *